United States Patent [19]
Kohara

[11] Patent Number: 4,740,451
[45] Date of Patent: Apr. 26, 1988

[54] PHOTOSENSITIVE COMPOSITIONS AND A METHOD OF PATTERNING USING THE SAME

[75] Inventor: Hidekatsu Kohara, Kanagawa, Japan

[73] Assignee: Tokyo Ohka Kogyo Co., Ltd., Kanagawa, Japan

[21] Appl. No.: 56,257

[22] Filed: May 26, 1987

Related U.S. Application Data

[63] Continuation of Ser. No. 936,921, Nov. 28, 1986, abandoned, which is a continuation of Ser. No. 677,463, Dec. 3, 1984, abandoned, which is a continuation-in-part of Ser. No. 584,924, Feb. 29, 1984, abandoned, which is a continuation of Ser. No. 413,489, Aug. 31, 1982, abandoned.

[51] Int. Cl.$^4$ ............................................. G03F 7/26
[52] U.S. Cl. .................................... 430/325; 430/194; 430/197; 430/302; 430/309
[58] Field of Search ............... 430/325, 302, 197, 195, 430/194, 192, 176, 309, 145

[56] References Cited

U.S. PATENT DOCUMENTS

| | | | |
|---|---|---|---|
| 3,467,518 | 9/1969 | Laridon et al. | 430/197 |
| 3,595,656 | 7/1971 | Ruckert et al. | 430/197 |
| 3,634,082 | 1/1972 | Christensen | 430/192 |
| 3,869,292 | 3/1975 | Peters | 430/197 |
| 3,984,250 | 10/1976 | Holstead et al. | 430/197 |
| 4,102,686 | 7/1978 | Weinberger et al. | 430/197 |
| 4,241,165 | 12/1980 | Hughes et al. | 430/197 |
| 4,267,258 | 5/1981 | Yaneda et al. | 430/306 |
| 4,352,878 | 10/1982 | Miura et al. | 430/325 |
| 4,356,247 | 10/1982 | Aotani et al. | 430/195 |
| 4,469,778 | 9/1984 | Iwayanagi et al. | 430/197 |

FOREIGN PATENT DOCUMENTS

| | | | |
|---|---|---|---|
| 45639 | 2/1982 | European Pat. Off. | 430/145 |
| 49-46287 | 12/1974 | Japan | 430/195 |
| 50-95002 | 7/1975 | Japan | 430/197 |

*Primary Examiner*—Charles L. Bowers, Jr.
*Attorney, Agent, or Firm*—Wyatt, Gerber, Shoup, Scobey and Badie

[57] ABSTRACT

The invention provides a novel and improved photosensitive or photocurable composition useful as a photoresist material in the manufacturing process of semiconductor devices such as LSIs by the lithographic process involving etching, in particular, with low temperature plasma in a dry process. The photoresist layer formed of the inventive composition is highly resistant against damages even by direct contacting with a photomask used in the pattern-wise exposure of the photoresist to light owing to the improved pliability thereof and good adhesion to the substrate surface in addition to the stability against the attack by the plasma. The composition comprises (a) a phenolic polymer, e.g. a novolac resin or a polymer of a hydroxystyrene, (b) an aromatic azide compound and (c) a polymer of a vinyl alkyl ether, the amounts of the compounds (b) and (c) being limited relative to the amount of the component (a). Best results of the pattern reproduction can be obtained only when the developer liquid following the patternwise irradiation of the photoresist layer is a specific solvent mixture which is a mixture of isoamyl acetate and methyl isobutyl ketone, isopropyl alcohol and xylene, or isoamyl acetate and ethyleneglycol monomethyl ether acetate in a specified weight proportion.

7 Claims, No Drawings

PHOTOSENSITIVE COMPOSITIONS AND A METHOD OF PATTERNING USING THE SAME

This is continuation of application Ser. No. 936,921, filed Nov. 28, 1986, abandoned, which is a continuation of application Ser. No. 677,463, filed Dec. 3, 1984, abandoned, which ia a continuation-in-part of application Ser. No. 584,924, filed Feb. 29, 1984abandoned, which was a continuation of Ser. No. 413,489, filed Aug. 31, 1982, and which is abandoned.

The present invention relates to a photosensitive or photocurable composition or, more particularly, to a photosensitive composition curable by the irradiation with actinic rays to give a cured film of the composition having excellent pliability and exhibiting good adhesion to the substrate surface as well as being highly resistant to low temperature plasma and a method of patterning using the same.

In the modern technology of electronics, as is well known, various kinds of semiconductor devices such as LSIs, ultra LSIs and the like are manufactured by means of the lithographic or photoetching techniques using a photoresist material and, as the density of integration in these devices increases, higher and higher resolution in the photoetched patterns is required reaching a fineness in the range of submicrons.

The methods of the exposure of the photoresist film to the actinic rays currently practiced in the lithographic process are classified into the contacting exposure, proximity exposure and projection exposure by use of a light, e.g. ultraviolet light, as well as the exposure by the scanning of electron beams. Setting aside the last mentioned method with electron beams, the former three methods are differentiated from each other by the relative disposition of the photoresist film and the photomask through which the light from a light source strikes on the pnotoresist film to be cured or insolubilized. In the proximity exposure and projection exposure, the photomask is held above the photoresist film at certain height so that the photoresist film is never contacted with the photomask and the danger is absolutely eliminated of the damages in both the photoresist film and the photomask due to the contacting of them with each other. In this respect, these methods of exposure are preferable with high yields of the photoetched products and high productivity.

These indirect or spaced photomasking methods in the exposure to light are, however, not always suitable for the manufacture of the semiconductor devices with extremely high resolution in the patterning since patterns with high resolution can hardly be obtained because of the phenomena of diffraction and interference of light more or less unavoidable when the photomask is held apart from the surface of the photoresist film.

The method of the contacting exposure, on the other hand, is performed by directly contacting the photomask with the surface of the photoresist film by pressing and/or by applying vacuum so that the problem of the above mentioned diffraction and interference of light can be solved to give a high resolution of patterning. This method is, however, not free from another problem caused by the direct contacting of the photomask and the photoresist film that sticking may take place between them or the photomask and/or the photoresist film are inadvertently damaged or scratched resulting in decreased yields of the products.

Further, it is a usual process that a semiconductor substrate provided with a pattern-wise photoresist film formed thereon by the pattern-wise exposure to light followed by developing is subjected to etching of the area not covered by the photoresist film. The most conventional mettod for etching is the so-called wet process etching, for example, in the case of semiconductor silicon by use of an etching solution containing hydrofluoric and nitric acids as the principal ingredients. This method of wet process etching is, however, not suitable when a high resolution of submicron range is desired in the etched pattern since the etching with an etching solution proceeds isotropically more or less with intrusion of the solution into the interface of the substrate surface and the photoresist film thereon in the lateral direction.

Accordingly, it is a recent trend to overcome the above problems that the wet process etching is being replaced more and more with a dry process etching, in which the surface of the semiconductor silicon substrate is etched anisotropically, i.e. in the direction perpendicular to the surface, by the exposure of the surface to an atmosphere of low temperature plasma of a gas having reactivity with the silicon, utilizing the benefit of the higher resolution in the etched pattern than in the wet process etching.

The requirements for the performance of the photoresist material to be used in the above mentioned dry process etching are even higher than for the photoresist material suitable for the wet process etching. For example, the photoresist material in this case should be highly pliable and exhibit good adhesion to the substrate surface if not to mention that the photoresist film must withstand the attack of the corrosive plasma gas. When the substrate surface of semiconductor silicon is covered with a film of a metal oxide instead of the silicon oxide, in particular, the above mentioned properties in combination are very essential for the photoresist material in order to keep the fine pattern of the resist film undestroyed to the completion of etching because the conditions for the dry process etching are more severe for the metal oxide film than for the silicon oxide film.

Needless to say, a variety of photosensitive or photocurable compositions have been developed and used in the art of photoetching with high sensitivity to the actinic rays although most of them are defective in either one or more respects of the above mentioned adhesion, pliability and anti-plasma resistance so that none of them can hardly be used as a photoresist material when the etching is to be performed by the dry process on the metal oxide-coated substrate surface to give an etched pattern with extremely high resolution.

SUMMARY OF THE INVENTION

An object of the present invention is therefore to provide a novel and improved photosensitive or photocuratle composition suitable for use as a photoresist material with high sensitivity to actinic rays to form a very fine pattern of the photoresist film on a substrate surface, the composition being imparted with high pliability and good adhesion to the subtrate surface on which it is photocured as well as resistance against the attack of the corrosive plasma gas to such an extent that any fine etched pattern with extremely high resolution can readily be obtained by use thereof in a dry process etching using low temperature plasma.

Another object of the invention is to provide a method for fine patterning using the novel photosensitive composition involving the step of contacting exposure of the photoresist layer to actinic rays without the problem in the fidelity of reproduction of the patterns.

The photosensitive composition of the present invention capable of satisfying the above requirements, having been developed as a result of the extensive investigations undertaken by the inventor, comprises, as the essential components thereof, (a) 100 parts by weight of a phenolic polymer composed of the recurring units of a phenolic compound, such as a novolac resin and a polymer of a vinylphenol, i.e. hydroxystyrene, (b) from 0.5 to 40 parts by weight of an aromatic azide compound, and (c) from 1 to 70 parts by weight of a poly(vinyl alkyl ether), of which the alkyl group has from 1 to 5 carbon atoms.

Further, the method of the invention for fine patterning comprises the steps of:

(A) forming a layer of the above defined photosensitive composition on the surface of a substrate;

(B) irradiating the layer of the photosensitive composition pattern-wise with actinic rays; and (C) developing the thus pattern-wise irradiated layer of the photosensitive composition with a developer liquid which is a binary solvent mixture selected from the group consisting of (i) a mixture of isoamyl acetate and methyl isobutyl ketone in a weight proportion in the range from 10:90 to 70:30, (ii) a mixture of isopropyl alcohol and xylene in a weight proportion in the range from 30:70 to 90:10, and (iii) a mixture of isoamyl acetate and ethyleneglycol monomethyl ether in a weight proportion in the range from 10:90 to 80:20, to selectively dissolve away the photosensitive composition on the areas where the photosensitive composition has not been irradiated with the actinic rays.

DETAILED DESCRIPTION OF THE PREFERRED EMBODIMENTS

The phenolic polymer as the component (a) mentioned above is a polymer of which each of the recurring monomeric units has at least one hydroxy group bonded to the benzene ring. The phenolic polymers suitable for use in the inventive composition include so-called novolac resins obtained by the polycondensation reaction of a phenolic compound, e.g. phenol, cresol, xylenol, cardanol and the like, with an aldehyde compound, e.g. formaldehyde, and polymers of a vinylphenol, i.e. hydroxystyrene. Various commercially available polymer products belong to these classes and may be used as such.

The aromatic azide compound as the component (b) is a compound comprising one or more of benzene rings and/or condensed-ring structures having at least one azide group —$N_3$ bonded to the aromatic nucleus. The aromatic nuclei may be further substituted with other substituent atoms and/or groups such as halogen atoms and lower alkyl groups, e.g. methyl and ethyl groups.

Types and examples of several aromatic azides suitable for use in the inventive composition are as follows, of which the bisazide compounds are preferred in the present invention.

(1) Phenyl azides, e.g. azidobenzene
(2) Azides of biphenyls, e.g. 4,4'-diazidobiphenyl and 3,3'-dimethyl-4,4'-diazidobiphenyl
(3a) Azides of diphenyl ethers, e.g. 4,4'-diazidodiphenyl ether and 3,3'-dichloro-4,4'-diazidodiphenyl ether
(3b) Azides of benzophenones, e.g. 4,4'-diazidobenzophenone and 3,3'-dichloro-4,4'-diazidobenzophenone
(3c) Azides of diphenyl methanes, e.g. 4,4'-diazidodiphenyl methane and 3,3'-dichloro-4,4'-diazidodiphenyl methane
(3d) Azides of diphenyl sulfides, e.g. 4,4'-diazidodiphenyl sulfide and 3,3'-dichloro-4,4'-diazidodiphenyl sulfide
(3e) Azides of diphenyl sulfones, e.g. 4,4'-diazidodiphenyl sulfone and 3,3'-dichloro-4,4'-diazidodiphenyl sulfone
(3f) Azides of stilbenes, e.g. 2,2'-diazidostilbene
(3g) Azides of dibenzylidene acetones, e.g. 4,4'-diazidodibenzylidene acetone
(3h) Azides of chalcones, e.g. 4,4'-diazidochalcone
(4) Azides of naphthalenes, e.g. 1-azidonaphthalene
(5) Azides of anthracenes, e.g. 1-azidoanthracene
(6) Azides of phenanthrenes, e.g. 1-azidophenanthrene
(7) Azides of pyrenes, e.g. 1-azidopyrene
(8) Azides of binaphthyls
(9) Azides of phenylnaphthalenes The component (c) in the photosensitive composition of the invention is a poly(vinyl alkyl ether) which is a polymer obtained by the polymerization of a vinyl alkyl ether of the formula $CH_2=CH-O-R$, where R is an alkyl group. Preferably, the alkyl group is a lower alkyl group having from 1 to 5 carbon atoms such as methyl, ethyl, n-propyl, isopropyl, n-butyl, isobutyl, n-amyl and isoamyl groups. More preferably, the alkyl group is a methyl or an ethyl group.

The amounts of the components (b) and (c) in the inventive composition are limited relative to the amount of the component (a). That is, the amount of the component (b) should be in the range from 0.5 to 40 parts by weight per 100 parts by weight of the component (a) since a composition containing the component (b) in an amount smaller than above has no sufficient sensitivity in the irradiation with actinic rays so that such a composition is unsuitable for use as a photoresist material while an excessively large amount of the component (b) than above may adversely affect the physical properties of the films formed of the composition with no additional beneficial effects thereby. Preferable amount of the component (b) in the inventive composition is in the range from 1 to 25 parts by weight per 100 parts by weight of the component (a).

The amount of the component (c) in the inventive composition, on the other hand, should be in the range from 1 to 70 parts by weight per 100 parts by weight of the component (a). This is because no sufficient improvement is obtained in the surface stickiness of the film formed of the composition so that a photomask placed on the photoresist film in direct contact therewith may suffer from sticking to the photoresist film in addition to the disadvantages of rather poor pliability of the photoresist film and poor adhesion thereof to the substrate surface. When the amount of the component (c) is in excess of 70 parts by weight per 100 parts by weight of the component (a), on the other hand, the composition may sometimes contain certain insoluble matter so that the development treatment by use of a solvent after pattern-wise exposure of the photoresist film to light may be disturbed. Preferable amount of the component (c) in the inventive composition is in the range from 5 to 50 parts by weight per 100 parts by weight of the component (a).

The photosensitive composition of the invention is prepared by mixing the components (a), (b) and (c) by use of a solvent capable of dissolving the components. Suitable solvents are exemplified by cyclohexanone, ethyleneglycol monomethyl ether, ethyleneglycol monoethyl ether, ethyleneglycol monobutyl ether, 2-ethoxyethyl acetate and the like. The concentration of the solutes in the solution should be determined in consideration of the viscosity of the solution as well as the desired thickness of the photoresist film formed of the solution on a substrate surface when the solvent has been evaporated. It is of course optional that the inventive composition or the solution of the components (a) to (c) further contains small amounts of additives such as an auxiliary resin, a plasticizer and a coloring agent to increase the visibility of the pattern-wise layer of the photoresist film after exposure to light followed by the development with a solvent. It is desirable that the solution is filtered, prior to application to the substrate surface, through a micropore membrane filter to remove any microscopically fine, insoluble particles which may be contained in the solution.

The photosensitive composition of the invention in the form of a solution can be applied by use of a suitable coating machine such as a spinner on to the surface of a substrate such as a film of a metal oxide, silicon oxide, silicon nitride, polycrystalline silicon and the like formed on the wafer of semiconductor silicon followed by the evaporation of the solvent to dryness to give a photoresist film thereon. The thickness of the photoresist film thus formed on a substrate surface should preferably be in the range from 0.3 to 1.5 μm as dried in order to obtain desired resolution of the etched pattern. The thickness can readily be controlled by using a solution of the composition having an appropriate concentration according to the desired thickness of the photoresist film.

The photoresist film obtained with the photosensitive composition of the invention is reliably safe from damages such as cracking and chipping during the process of exposure to light through a photomask in direct contact therewith by virtue of the highly improved pliability of the film and the adhesion thereof to the substrate surface in addition to the outstanding resistance of the film against the attack of the corrosive plasma gas. The exposure of the photoresist film on the substrate surface to light through a patterned photomask is followed by the development treatment in which the unexposed and hence uncured areas of the photoresist film are dissolved away by use of a suitable developer liquid to leave a pattern-wise layer of the cured composition of the invention.

Many organic solvents can dissolve the uncured photosensitive composition after the pattern-wise irradiation of the layer as described above and hence are usable as the developer liquid. It should be noted, however, that best results of development in respect of the fidelity of the pattern reproduction can be obtained only be use of a specific type of the developer liquid and the extensive experiments by the inventors have arrived at a conclusion that the developer liquid should be selected from the group of binary solvent mixtures consisting of (i) a mixture of isoamyl acetate and methyl isobutyl ketone in a weight proportion from 10:90 to 70:30 or, preferably, from 30:70 to 40:60, (ii) a mixture of isopropyl alcohol and xylene in a weight proportion in the range from 30:70 to 90:10 or, preferably from 55:45 to 65:35, and (iii) a mixture of isoamyl acetate and ethyleneglycol monomethyl ether in a weight proportion in the range from 10:90 to 80:20 or, preferably, from 40:60 to 50:50.

The above recited weight proportion of the two solvents in each of the solvent mixtures as the developer liquid is essential. In the first type of the mixture, for example, no development can be obtained with a solvent mixture containing an excessively large proportion of isoamyl acetate over the above range while difficulties are encountered in the control of the reproduced pattern profile when the solvent mixture contains a larger amount of methyl isobutyl ketone than the upper limit of the above range. Similarly, an excessively large proportion of isopropyl alcohol in the second type of the solvent mixtures results in difficulties in the profile control of the reproduced pattern while no development can be obtained when the weight proportion of isopropyl alcohol is smaller than the lower limit of the above range. Further, in the third type of the solvent mixtures, no development can be obtained with a mixture containing an excessively large weight proportion of isoamyl acetate while difficulties are encountered in the profile control of the reproduced pattern with a solvent mixture deficient in the proportion of isoamyl acetate.

As is understood from the above description, the photosensitive composition of the present invention is useful in the technology of photographic plate making with capability of giving very fine patterns by the irradiation with actinic rays, e.g. ultraviolet light, without being damaged even in the contacting exposure by virtue of the excellent pliability of the film and the good adhesion thereof to the substrate surface along with the high resistance to withstand dry etching. In particular, the photosensitive composition of the invention is very useful in the manufacture of electronic divices including semiconductors as the base material.

In the following, the present invention is described in further detail by way of examples.

EXAMPLE 1

A coating solution of the inventive photosensitive composition was prepared by dissolving 60 g of a novolac resin (PR-1050, a product by Sumitomo Durez Co., Ltd.), 40 g of a poly(vinyl methyl ether) and 10 g of 4,4'-diazidodiphenyl sulfide in 400 g of 2-ethoxyethyl acetate followed by filtration of the solution through a microporous membrane filter to remove microscopic insoluble matter.

The thus prepared coating solution was applied on to the substrate surface of a silicon wafer having an oxide layer of 0.5 μm thickness by use of a spinner followed by pre-baking at 85° C. for 30 minutes to form a dried resist film having a thickness of 1.0 μm. This photoresist film was irradiated pattern-wise with ultraviolet light from a xenon-mercury lamp of 500 watts power for 1.5 seconds through a quartz-made test chart mask directly contacted therewith and then developed with a solvent mixture composed of 33.3% by weight of isoamyl acetate and 66.7% by weight of methyl isobutyl ketone as the developer liquid followed by rinse with xylene to give a line-and-space patterned layer of the photoresist of which the areas with the cured resin composition had a width of 0.5 μm. This pattern-wise layer of the photoresist as well as the photomask were free from damages of scratches even after the contacting exposure to light.

The pattern-wise layer of the photoresist was resistant against the attack of low temperature plasma in the dry etching without problems.

EXAMPLE 2

A coating solution was prepared by dissolving 70 g of a novolac resin (CKM-2400, a product by Showa Union Gosei Co.), 30 g of a poly(vinyl methyl ether) and 15 g of 4,4'-diazidochalcone in 400 g of cyclohexanone and applied to the surface of a silicon wafer having an oxide layer of 0.5 μm thickness followed by pre-baking at 85 °C. for 30 minutes to give a photoresist layer of 1.0 μm thickness.

This photoresist layer was irradiated with ultraviolet light from a 250 watts ultra-high pressure mercury lamp for 5 seconds through a glass-made test chart mask directly contacted therewith followed by the development treatment with a solvent mixture of 60% by weight of isopropyl alcohol and 40% by weight of xylene and rinse with xylene to give a pattern-wise layer of the photoresist having line portions of the cured photoresist composition with a width of 0.5 μm. The thus formed pattern-wise layer of the photoresist had no defects of damages or scratches after the contacting exposure.

EXAMPLE 3

An aluminum film of 0.5 μm thickness was formed by vacuum deposition on a silicon wafer having a 0.5 μm difference in level provided by etching and a layer of the photoresist was fromed thereon in the same manner as in Example 1. This photoresist layer was irradiated with ultraviolet light from a 500 watts xenon-mercury lamp for 1.5 seconds through a quartz-made test chart mask directly contacted therewith and then developed with a solvent mixture of 45% by weight of isoamyl acetate and 55% by weight of ethyleneglycol monomethyl ether as the developer liquid followed by rinse with xylene and post-baking at 130 °C. to give a pattern-wise resist layer having line portions of the cured photoresist composition with a width of 0.5 μm. This pattern-wise layer of the photoresist was free from damages.

The thus prepared silicon wafer provided with the pattern-wise layer of the photoresist on the aluminum film was subjected to dry etching by placing it in the plasma chamber equipped with a pair of parallel-plate electrodes in the apparatus for dry etching (OAPM-500 manufactured by Tokyo Ohka Kogyo Co., Ltd.) into which a reactive gas mixture of carbon tetrachloride and helium in a volume ratio of 1:10 was introduced at a reduced pressure of 0.310 Torr while low temperature plasma was generated therein by supplying an electric power of 150 watts to effect dry etching of the aluminum film. The velocity of etching in the aluminum layer was 200 nm/minute and no changes were noted in the pattern-wise layer of the photoresist even after 8 minutes of the etching indicating the great stability of the photoresist composition against the attack of the plasma.

Thereafter, the pattern-wise layer of the photoresist was removed by the oxidation thereof with oxygen plasma generated in the same plasma chamber by introducing oxygen gas in place of the reactive gaseous mixture so that a line-wise patterned layer of aluminum was obtained with a line width of 0.5 μm.

EXAMPLE 4

A coating solution was prepared by dissolving 70 g of a poly(4-hydroxystyrene) having an average molecular weight of about 8500 (Resin M, a product by Maruzen Oil Co., Ltd.) in place of the novolac resin in Example 2 above in 400 g of 2-ethoxyethyl acetate together with 30 g of a poly(ethyl vinyl ether) and 15 g of 4,4'-diazidochalcone.

A silicon wafer was provided in the same manner as in Example 2 with a line-wise patterned layer of the photoresist composition, which could withstand and was highly resistant against the attack of the plasma in the dry etching carried out in the same manner as in Example 3.

COMPARATIVE EXAMPLE 1

A coating solution was prepared by dissolving 100 g of a novolac resin (PR-1050, a product by Sumitomo Durez Co., Ltd.) and 20 g of 4,4'-diazidodiphenyl sulfide in 400 g of 2-ethoxyethyl acetate.

Pattern formation with this coating solution was performed on a silicon wafer in the same manner as in Example 1. The thus formed pattern-wise photoresist layer was defective with damages caused in the contacting exposure and had cracks in the photocured areas.

What is claimed is:

1. A method for forming a pattern-wise resist layer on the surface of a substrate which comprises the steps of:
(A) forming on the surface of a substate a layer of a photosensitive composition comprising an admixture of
  (a) 100 parts by weight of a phenolic polymer composed of the recurring monomeric units of a phenolic compound,
  (b) from 0.5 to 40 parts by weight of an aromatic azide compound, and
  (c) from 1 to 70 parts by weight of a poly(vinyl alkyl ether), of which the alkyl group has from 1 to 5 carbon atoms;
(B) irradiating the layer of the photosensitive composition on the substrate surface pattern-wise with actinic rays; and
(C) developing the thus pattern-wise irradiated layer of the photosensitive composition with developer liquid which is a binary mixture of organic solvents selected from the group consisting of
  (i) a mixture of isoamyl acetate and methyl isobutyl ketone in a weight proportion in the range from 10:90 to 70:30,
  (ii) a mixture of isopropyl alcohol and xylene in a weight proportion in the range from 30:70 to 90:10, and
  (iii) a mixture of isoamyl acetate and ethyleneglycol monomethyl ether in a weight proportion in the range from 10:90 to 80:20,
to selectively dissolve away the photosensitive composition on the areas where the photosensitive composition has not been irradiated with the actinic rays.

2. The method as claimed in claim 1 wherein the phenolic polymer is a novolac resin or a polymer of a hydroxystyrene.

3. The method as claimed in claim 1 wherein the aromatic azide compound is selected from the class consisting of phenyl azides, azides of biphenyls, azides of diphenyl ethers, azides of benzophenones, azides of diphenyl methanes, azides of diphenyl sulfides, azides of diphenyl sulfones, azides of stilbenes, azides of dibenzylidene acetones, azides of chalcones, azides of naphthalenes, azides of anthracenes, azides of phenanthrenes, azides of pyrenes, azides of binaphthyls and azides of phenylnaphthalenes unsubstituted or substituted on the aromatic nucleus with a halogen atom or an alkyl group.

4. The method as claimed in claim 1 wherein the aromatic azide compound is an aromatic bisazido compound.

5. The method as claimed in claim 1 wherein the poly(vinyl alkyl ether) is a poly(vinyl methyl ether) or a poly(vinyl ethyl ether).

6. The method as claimed in claim 1 wherein the amount of the component (b) is in the range from 1 to 25 parts by weight of the component (a).

7. The method as claimed in claim 1 wherein the amount of the component (c) is in the range from 5 to 50 parts by weight per 100 parts by weight of the component (a).

* * * * *

UNITED STATES PATENT AND TRADEMARK OFFICE
CERTIFICATE OF CORRECTION

PATENT NO. : 4,740,451
DATED : April 26, 1988
INVENTOR(S) : Hidekatsu Kohara

It is certified that error appears in the above—identified patent and that said Letters Patent is hereby corrected as shown below:

On the title page

After line 21 insert:

[30]  Foreign Application Priority Data
      Oct. 26, 1981     Japan.............56-170989

Signed and Sealed this

Sixth Day of December, 1988

Attest:

DONALD J. QUIGG

Attesting Officer    Commissioner of Patents and Trademarks